(12) United States Patent
Ueno

(10) Patent No.: US 6,333,483 B1
(45) Date of Patent: Dec. 25, 2001

(54) METHOD OF MANUFACTURING CIRCUIT MODULES

(75) Inventor: Mitsuo Ueno, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/054,395

(22) Filed: Apr. 3, 1998

(30) Foreign Application Priority Data

Apr. 4, 1997 (JP) .................................... 9-086279

(51) Int. Cl.[7] .................................... B23K 26/00
(52) U.S. Cl. ................ 219/121.64; 219/121.63; 219/121.6
(58) Field of Search ............ 219/121.64, 121.63, 219/121.6, 121.11, 121.12, 121.13, 121.14, 121.16

(56) References Cited

U.S. PATENT DOCUMENTS 5,227,604 * 7/1993 Freedman ..................... 219/121.63
5,406,701 * 4/1995 Pepe et al. ......................... 29/840

* cited by examiner

*Primary Examiner*—M. Alexander Elve
(74) *Attorney, Agent, or Firm*—Lowe Hauptman Gilman & Berner, LLP

(57) ABSTRACT

Circuit modules are made by melting solder on a land by irradiating the solder with a laser beam, and then pressing an external electrode of an electronic component to the melted solder before the melted solder hardens.

23 Claims, 9 Drawing Sheets

METHOD OF MANUFACTURING CIRCUIT MODULES

BACKGROUND OF THE INVENTION

1. Field of the Invention

The present invention relates to a method of manufacturing circuit modules and more particularly to a method wherein a connecting material mass is melted prior to an electrode of a component being pressed against the melted mass.

2. Description of the Prior Art

Japanese Patent Application Laid-Open No. 4-314390 discloses a method for mounting an electronic component on a substrate by utilizing a laser beam. Speaking concretely, this patent application discloses a method which loads an electronic component on a substrate so that an external electrode of the component is brought into contact with a cream solder preliminarily applied to a surface of a land and electrically connects the external electrode to the land by way of the solder by irradiating with a laser beam for the cream solder and melting it.

Since this method irradiates the cream solder with the laser beam after the electronic component is loaded on the substrate so that the external electrode of the electronic component is brought into contact with the cream solder preliminarily applied to the surface of the land, it is incapable of directly irradiating the cream solder applied to areas which are sandwiched and shaded by the external electrode and the land.

In other words, this method has a defect that it allows the cream solder to remain unmelted on the areas which are sandwiched and shaded by the external electrode and the land, thereby causing improper connections due to insufficient connecting areas and strengths.

This defect can be corrected to a certain degree by setting an energy (a product of a power multiplied by an irradiation time) of the irradiating laser beam at a high level. When the power of the laser beam is strengthened, however, the electronic component is subjected to bad thermal damage, thereby posing problems of degradation in qualities and variations of characteristics. When the irradiation time of the laser beam is prolonged, on the other hand, each component requires a longer connecting time, thereby making it impossible to accelerate manufacturing of circuit modules.

SUMMARY OF THE INVENTION

A primary object of the present invention is to provide a manufacturing method of circuit modules which solves the problem of improper connection and permits favorably connecting electronic components with a laser beam, and a manufacturing apparatus of circuit modules which is capable of securely carrying out this method.

To attain this object, the manufacturing method according to the present invention comprising steps of melting a connecting material preliminarily disposed on electrodes of a substrate by an energy of an irradiating laser beam, and loading an electronic component on the substrate so as to press electrodes of this component to the melted connecting material before the melted connecting material hardens.

This method is capable of solving the problem of the residual unmelted connecting material by sufficiently heating and melting the connecting material on the electrodes of the substrate with the irradiating laser beam, thereby making it possible to connecting the electrodes of the component to the electrodes of the substrate with connecting materials which are sufficiently heated and melted.

On the other hand, the manufacturing apparatus according to the present invention comprises a component loading device having an adsorbing nozzle which absorbs an electronic component and loads it on a substrate, a laser beam irradiation device which irradiates a laser beam to a connecting material preliminarily disposed on an electrode of the substrate, and a control device which controls the component loading and the laser beam irradiation so that the electrodes of the electronic component are pressed to the melted connecting materials after the connecting materials are melted by an energy of the irradiating laser beam and before the melted connecting materials harden.

This apparatus is capable of securely carrying out the manufacturing method described above with the component mounting device, the laser beam irradiation device and the control device which controls the former two devices.

The object described above, other objects, features and advantages of the present invention will be apparent from the following description and the attached drawings.

DESCRIPTION OF THE PREFERRED EMBODIMENTS

Figure 1:
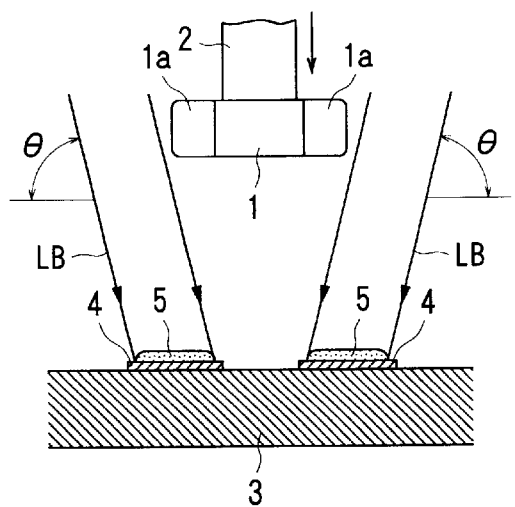
FIGS. 1(a) through 1(f) are views illustrating component mounting processes in a first embodiment of the manufacturing method according to the present invention.
Figure 1:
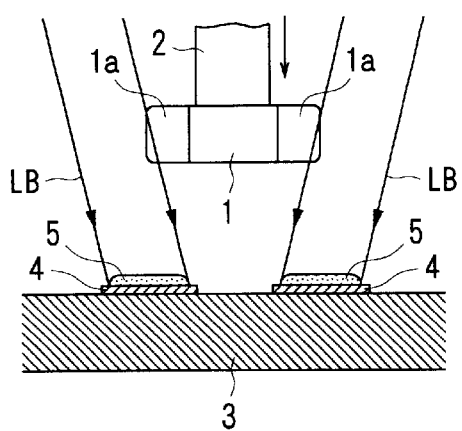
Figure 1:
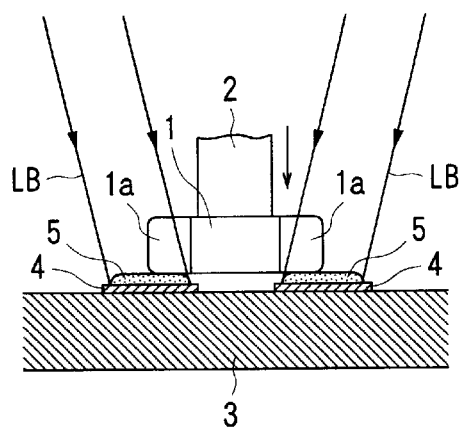
Figure 1:
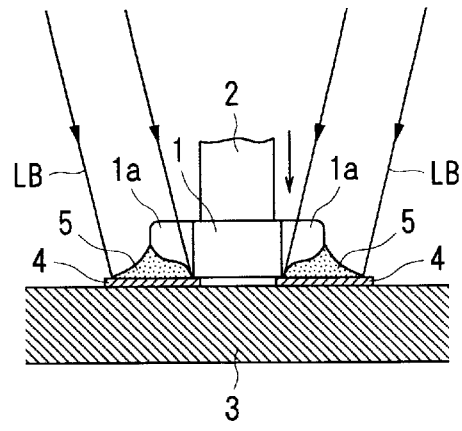
Figure 1:
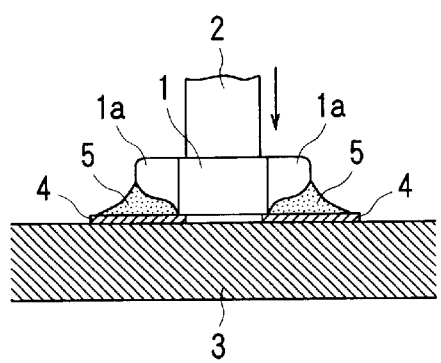
Figure 1:
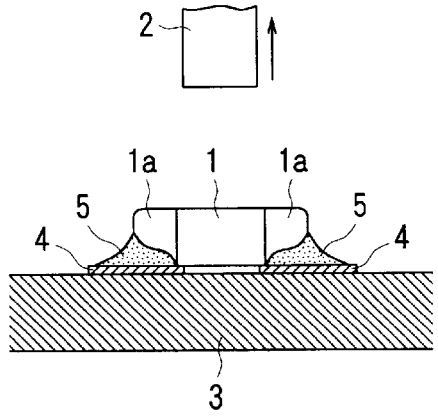
Figure 2:
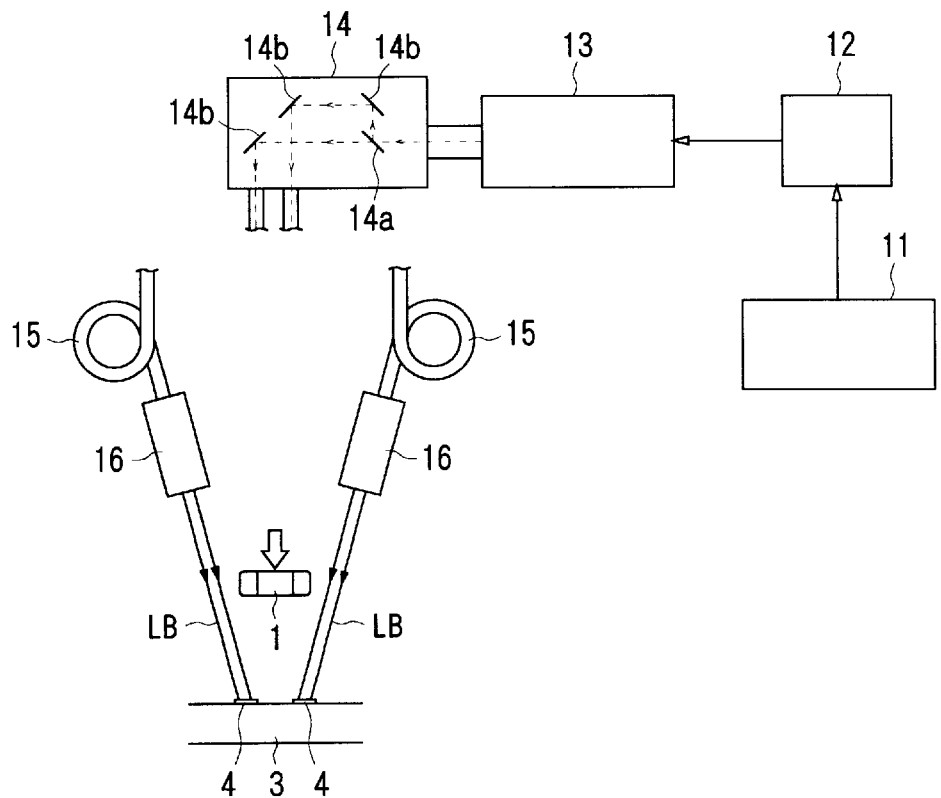
FIG. 2 is a constitutional diagram illustrating an optical system and a control system used for a component mounting in the first embodiment.
Figure 3:
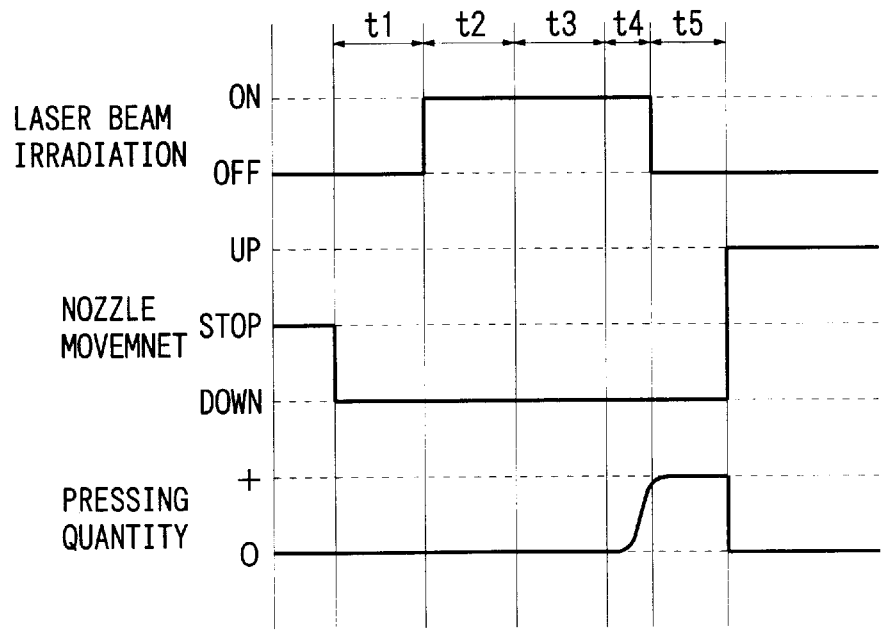
FIG. 3 is a timing chart of the component mounting in the first embodiment.
Figure 4:
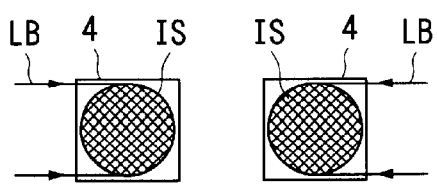
FIGS. 4(a) through 4(c) are diagrams illustrating shapes of irradiating laser beams on lands in the first embodiment.
Figure 4:
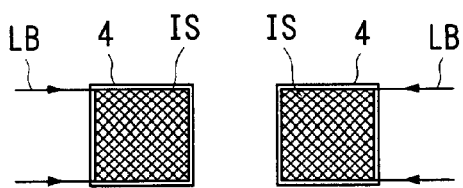
Figure 4:
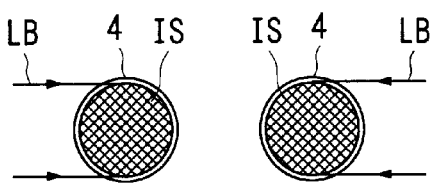
Figure 5:
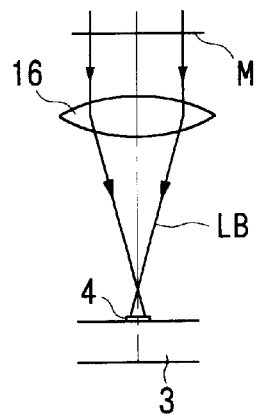
FIGS. 5(a) and 5(b) are diagrams illustrating conditions of irradiation with laser beams relative to lands in the first embodiment.
Figure 5:
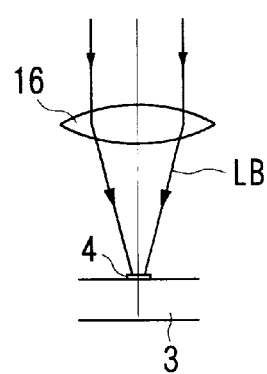

FIGS. 1 through 5 illustrate a first embodiment of the present invention. FIGS. 1(a) through 1(f) showing component mounting processes, FIG. 2 showing a constitutional diagram of an optical system and a control system to be used for a component mounting, FIG. 3 showing a timing chart of the component mounting, FIG. 4 showing shapes of irradiating laser beams on lands, and FIG. 5 showing conditions of irradiation with laser beams relative to lands.

In FIGS. 1(a) through 1(f), reference numeral 1 represents an electronic component, reference numeral 2 designates an adsorbing nozzle which is movable up and down, reference numeral 3 denotes a substrate, reference numeral 4 represents lands (electrodes of the substrate) and reference numeral 5 denotes a solder mass.

The electronic component 1 has a flat prism-shape and a pair of external electrodes 1a at opposite longitudinal ends of the chip. Examples of chip component 1 are a chip resistor, a chip capacitor and a chip inductor.

The solder 5 is cream solder mass having a basic material made of Sn-Pb series alloy kneaded with a flux with a melting temperature around 150 to 400 degrees, and is preliminarily coated over entire top surfaces of the lands 4. Needless to say, a solder mass 5 which contains basic material, for example, of an Sn series alloy, an Ag series alloy, an IN series alloy or an Au series alloy can be used dependently on kinds and wavelengths of the laser beam LB as well as heat resistance and electrode materials of the electronic component 1 and the substrate 3. Further, the solder mass 5 is not limited to the cream solder, and may be precoated by solder plating or another method or have a bump form.

In FIG. 2, a reference numeral 11 represents a computer which performs a sequence control of operations of the adsorbing nozzle 2 and laser oscillation, a reference numeral 12 designates a laser power source, a reference numeral 13 denotes a laser oscillator, a reference numeral 14 represents a beam splitter, a reference numeral 15 designates an optical fiber which transmits a laser beam, a reference numeral 16 denotes an objective optical element consisting of a condenser lens, etc., and a reference symbol LB represents a laser beam.

The laser oscillator 13 is a laser which has a wavelength in the infrared region, for example a YAG laser, a $CO_2$ laser or a CO laser having CW oscillation or pulse oscillation and has a power on the order of 100 W. Needless to say, another infrared laser or a visible ray laser such as YAG:SHG may be used. Though a kind and a wavelength of the laser are adequately selected dependently on heat resistances and electrode materials of the electronic component 1 and the substrate 3 as well as kinds and properties of the solder 5, it is preferable to use the YAG laser which allows a little loss to be caused due to reflection on solder surfaces. The laser oscillator 13 has a built-in shutter (not shown) which controls laser oscillation.

The beam splitter 14 is equipped with a half mirror 14a and three mirrors 14b. This beam splitter 14 splits a laser beam LB emitted from the laser oscillator 13 into two beams having energies matched with each other. Needless to say, a number and a configuration of the mirrors are not limited to those illustrated in the drawing so far as the laser beam LB emitted from the laser oscillator 13 can be split with no difference between their optical paths and projected simultaneously, and the beam splitter may use, for example, the half mirror 14a and a single mirror 14b.

The optical fibers 15 transmit the split laser beams LB to the two objective optical elements 16 respectively. The optical fibers 15 are selected from among quartz series fibers, KRS series fibers and other known optical fibers dependently on kinds and wavelengths of the laser to be used.

The objective optical elements 16 project the laser beams LB to the two lands 4 corresponding to the electronic component 1. In the example shown in the drawing, the two objective optical elements 16 are disposed symmetrically on both sides in a longitudinal direction of the electronic component 1 which is perpendicularly lowered at an acute angle relative to a mounting surface of the substrate 3.

Now, processes of component mounting in the first embodiment will be described with reference to FIG. 1 and FIGS. 3 through 5.

First, the electronic component 1 supplied to a component supply location (not shown) in an attitude turned sideways is taken out while adsorbing a middle portion of its top surface with the adsorbing nozzle 2, and the adsorbing nozzle 2 adsorbing the electronic component 1 is shifted over to the substrate 3 and kept at a standby location at which the external electrodes 1a of the electronic component 1 are positioned to corresponding the lands 4.

Then, at the beginning of predetermined time interval t1, (FIG. 3), the electronic component 1 is initially lowered at a constant speed from the standby location by the adsorbing nozzle 2 perpendicularly (at a right angle relative to the mounting surface of the substrate 3). Nozzle 2 continues to lower component 1 at constant speed until completion of predetermined time interval t5. Predetermined time intervals t2, t3 and t4 occur continuously in sequence from the end of interval t1 to the beginning of interval t5. Laser beams LB are projected simultaneously to the solder masses 5 on the lands 4 as shown in FIG. 1(a) at the end of time interval t1, i.e., after a predetermined time (t1) has elapsed from starting of the lowering operation. Each of the irradiating laser beams LB has a power of about 1 to 50 W though it is different depending on heat resistances and electrode materials of the electronic component 1 and the substrate 3 as well as kinds of the solder 5.

As seen from FIG. 1(a), each of the irradiating laser beams LB is inclined at an acute angle θ (approximately 75 degrees in the drawing) relative to the mounting surface of the substrate 3 so that the laser beams LB are irradiated to the solder 5 from both the sides in the longitudinal direction of the electronic component 1.

Though the laser beam LB may have an irradiating shape IS for the land 4 which is circular or elliptic as shown in FIG. 4(a), it is desirable to configure the irradiating shape IS as close as possible to a shape of a planar surface of the land 4 so that the solder mass 5 is heated and melted ununiformly as a whole even when the planar shape of the land 4 is rectangular. It is possible to heat the solder 5 uniformly as a whole and prevent the solder from being melted ununiformly by using a mask or the like so as to match the irradiating shape IS of the laser beam LB nearly with a planar shape of the land 4, for example, when the planar shape of the land 4 is rectangular (see FIG. 4(b)) or configuring the irradiating shape IS of the laser beam LB so as to have a circular shape which is nearly matched with a circular planar shape when the land 4 has a circular planar shape (see FIG. 4(c)).

Further, an image formation heating mode which is configured on a premise to use a mask M as shown in FIG. 5(a) and a focal point heating mode which is configured on a premise not to use a mask as shown in FIG. 5(b) can be utilized as occasion demands for irradiation of the land 4 with the laser beam LB. The image formation heating mode permits obtaining an optional irradiating shape by selecting a mask which has an adequate shape. The focal point heating mode assures no energy loss since the laser beam LB is not shielded by a mask.

Upon completion of predetermined time interval t2, i.e., after time t2 has elapsed from the beginning of irradiation irradiation of mass 5 by laser beam LB, the external electrodes 1a of the electronic component 1 enter optical paths of the laser beams LB as shown in FIG. 1(b), whereby portions of the irradiating laser beams LB irradiate the external electrodes 1a respectively of the electronic component 1. During the time interval t2 mentioned above, each solder mass 5 is irradiated as a whole with the laser beam LB, thereby being sufficiently heated to be melted by an energy of the laser beam LB.

After the predetermined time interval t3 has elapsed, i.e., after the external electrodes 1a of the electronic component have been in the optical paths of the laser beams LB be a period of t3, bottom surfaces of the external electrodes 1a of the electronic component 1 are brought into contact with the melted solders 5 as shown in FIG. 1(c). During the time interval t3, the external electrodes 1a of the electronic component 1 are heated to a temperature higher than normal ,i.e, ambient temperature by the energy of the laser beams LB.

During the predetermined time interval t4 the external electrodes 1a of the electronic component 1 are brought into contact with the melted solder mass 5. During interval t4, each of the external electrodes 1a is pressed to the melted solder 5, and the melted solder 5 turns and adheres to other surfaces of each of the external electrodes 1a as shown in FIG. 1(d). The external electrodes 1a of the electronic component 1 are typically pressed to the melted solder mass 5 under a maximum pressure of 300 to 2000 g.

Though irradiation with the laser beam LB is stopped upon completion of the time interval t4, the pressing of the electronic component 1 is continued until completion of predetermined time interval t5 that begins when irradiation of masses 5 with the laser beams LB stops. During time interval t5, the melted solder mass 5 sets, whereby the external electrodes 1a of the loaded electronic component 1 are electrically connected to the lands 4 of the substrate 3 by way of a solder joint formed between the solder masses 5 and electrodes 1a.

Upon completion of the above-mentioned time interval t5, the adsorbing nozzle 2 is freed from a negative pressure and rises, and mounting of one electronic component 1 completes.

Each of the above-mentioned predetermined time intervals t1, t2, t3 and t5 is typically approximately 10 msec, and time interval t4 is typically approximately 5 msec. That is, the time required to mount one electronic component 1 is approximately 45 msec as measured from the beginning of time interval t1, when lowering the electronic component 1 begins from the standby location, so that the component mounting can be performed in an extremely short time.

Further, the time during which the external electrodes 1a of the electronic component 1 are irradiated with the laser beams LB (=t3+t4) is approximately 15 msec. The ratio of time intervals t3 and t4 relative to t2 can be defined by the laser beam inclination angle θ and a loading speed of the electronic component 1. In other words, the time during which the external electrodes 1a are irradiated with the laser beams LB can be shortened by reducing the angle θ or accelerating a loading speed.

The first embodiment, which is configured to press the external electrodes 1a of the electronic component 1 after melting the solders 5 with the energy of the irradiating laser beams LB by irradiating the solders 5 on the lands 4 and before the melted solders 5 hardens, is capable of sufficiently heating and melting the solders 5 on the lands 4 with the irradiating laser beams LB, and connecting the external electrodes 1a of the electronic component 1 to the lands 4 of the substrate 3 using the solder 5 sufficiently heated and melted.

Accordingly, the first embodiment is capable of connecting components extremely favorably with the laser beams LB by solving the problems of improper connection due to residual unmelted solder without setting an energy of the irradiating laser beams LB at a high level.

Further, the first embodiment, which is configured to allow the external electrodes 1a of the electronic component 1 to enter the optical paths of the laser beams LB so as to be irradiated with the laser beams LB from mid course of the lowering process, heats the external electrodes 1a to a temperature higher than normal temperature before soldering, thereby bringing the external electrodes 1a into closer contact with the melted solder 5 and carrying out soldering with a higher quality.

Furthermore, the first embodiment, which continues the irradiation of the solders 5 with the laser beams LB until the time t4 elapses after the external electrodes 1a of the electronic component 1 are pressed to the melted solder 5, is capable of maintaining the solder 5 in an adequately melted condition by supplementing heat which is deprived due to the contact with the external electrodes 1a and turning the melted solder 5 to the surfaces of the external electrodes 1a.

Still further, the first embodiment, which can complete mounting of one electronic component 1 in approximately 45 msec after the electronic component 1 starts lowering from the standby location, is capable of shortening a time required for mounting per component and accelerating components mounting, and provides an advantage to follow a high speed type electronic components feeding apparatus which is capable of supplying components at a feeding rate of 0.1 sec per component.

Moreover, the first embodiment, which is capable of heating and melting only the solders 5 on the lands 4 on which the electronic component 1 is to be mounted, makes it possible to mount components at a narrow pitch and with a high precision by solving a problem posed by the reflow soldering that the solders 5 on adjacent lands 4 are simultaneously heated and melted and caused mutual shorting.

Figure 6:
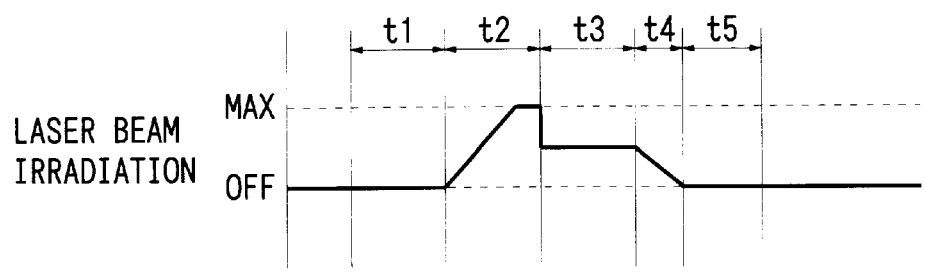
FIG. 6 is a timing chart illustrating a control method for varying a power of an irradiating laser beam.

Though the first embodiment described above exemplifies the laser beams LB which have a constant power and are subjected to an on-off control for irradiation, it is possible to control the irradiating laser beams LB so as to vary a power thereof. FIG. 6 exemplifies a variable control wherein the power of the irradiating laser beams LB is gradually strengthened to a maximum level after starting irradiation with the laser beams LB until the time interval t2 elapses. The power of the irradiating laser beams LB is kept lower than the maximum level after the external electrodes 1a of the electronic component 1 enter the optical paths of the irradiating laser beams LB until time interval t3 elapses. The power of the irradiating laser beams LB is gradually lowered after the external electrodes 1a of the electronic component 1 are brought into contact with the melted solder 5 until the time interval t4 elapses and the irradiation with the laser beams LB is stopped upon lapse of the time interval t4. By controlling the power of the irradiating laser beams as described above, it is possible to prevent solder balls or the like from being produced due to abrupt heating of the solder 5 and suppress thermal damage on the electronic component 1 due to irradiation of the external electrodes 1a with the irradiating laser beams LB.

One method of varying the power of the irradiating laser beams LB is to control the power source 12 of the laser oscillator 13. Another method of varying the power of the laser beams LB incident on solder masses 5 is to interpose an intensity adjusting filter, such as an ND filter, in mid course of the optical path. Another power varying method is to interpose an optical element having an intensity control hole (such as a slit) in mid course of the optical path. Also, energy density of the irradiating laser beam LB can be varied by using a lens, a beam expander, or the like as occasion demands.

FIGS. 7 and 8 show methods for irradiation with laser beams which are respectively different from that adopted for the first embodiment.

Figure 7A:
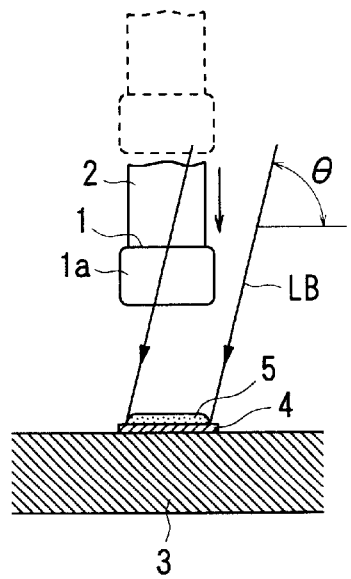
FIGS. 7(a) and 7(b) are diagrams illustrating a modified method to irradiate a land with a laser beam.
Figure 7B:
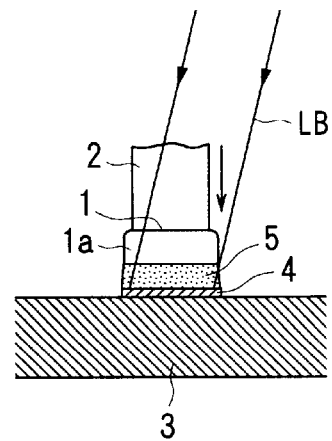

The irradiation method shown in FIGS. 7(a) and 7(b) is configured to irradiate each solder 5 obliquely with laser beams LB from one side in a width direction of the electronic component 1. Each of the laser beams LB (a laser beam on a deeper side not shown) is inclined at an acute angle θ relative to the mounting surface of the substrate 3 (approximately 75 degrees in the drawings) and projected to each solder 5 obliquely from the one side in the direction of the width of the electronic component 1. When the laser beams LB are projected as described above, it is possible, similarly to the first embodiment, to melt the solders 5 on lands 4 with the energy of the irradiating laser beams LB, then press external electrodes 1a of the electronic component 1 to the melted solders 5 before it sets and warm up the external electrodes 1a of the electronic component 1 with the laser beams LB from mid course of the lowering process.

Figure 8A:
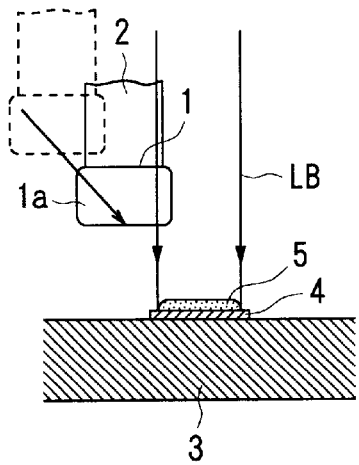
FIGS. 8(a) and 8(b) are diagrams illustrating another modified method to irradiate a land with a laser beam.
Figure 8B:
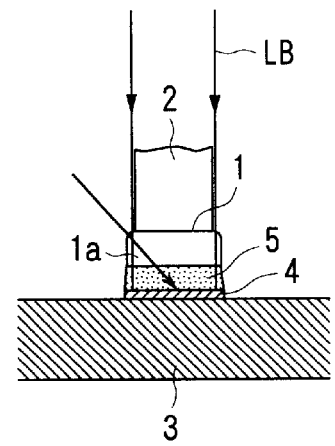

The irradiation method shown in FIGS. 8(a) and 8(b) is configured to project each laser beam LB perpendicularly to solders 5 on each land 4 (perpendicularly to a mounting surface of a substrate 3). While projecting each laser beam LB (a laser beam on a deeper side not shown) perpendicularly to each solder 5, a moving path for lowering an electronic component 1 with an adsorbing nozzle 2 is inclined at an acute angle θ relative to the substrate 3 (approximately 50 degrees in the drawings) so that external electrodes 1a of the electronic component 1 to be mounted on the substrate 3 are irradiated with portions of the irradiating laser beams LB in the course of the lowering process. When the laser beams LB are projected as described above, it is also possible, similarly to the first embodiment, to melt the solders 5 on the lands 4 with the energy of the irradiating laser beams LB, then press the external electrodes 1a of the electronic component 1 to the melted solders 5 before it sets and warm up the external electrodes 1a of the electronic component 1 with the laser beams LB from mid course of the lowering process.

Figure 9:
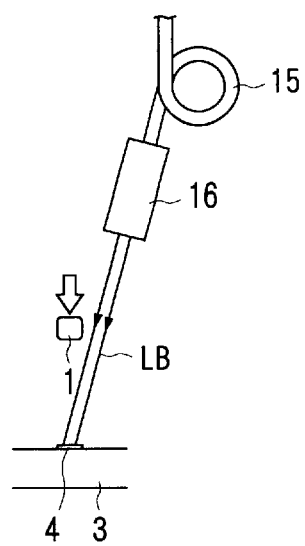
FIGS. 9(a) through 9(e) are diagrams illustrating modified optical systems.
Figure 9:
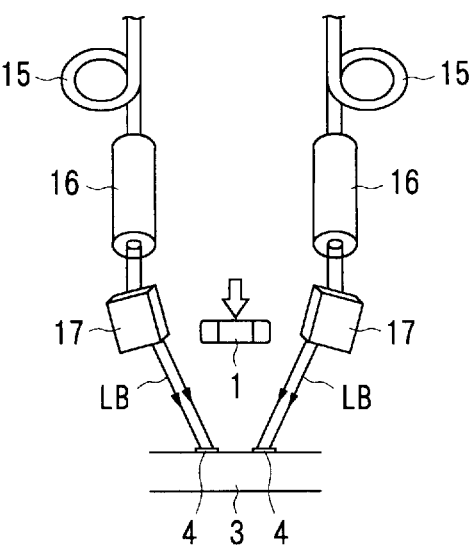
Figure 9:
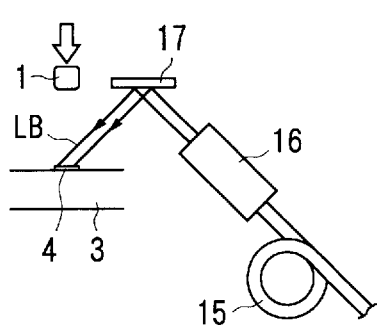
Figure 9:
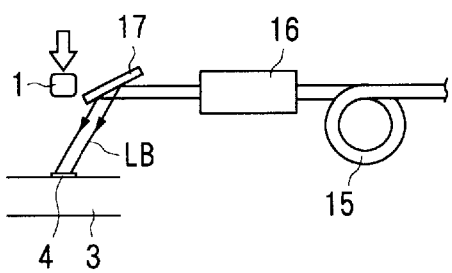
Figure 9:
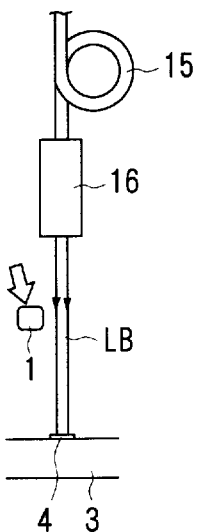

FIGS. 9(a) through 9(b) show optical systems having configurations which are different from that of the optical system of the first embodiment.

The optical system shown in FIG. 9(a) is configured to project laser beams LB to solder on the lands 4 obliquely from one side in a direction of width of an electronic component 1 and applicable to the irradiation method with laser beams shown in FIG. 7. Laser beams LB emitted from a laser oscillator (not shown) are projected simultaneously to two lands 4 corresponding to the electronic component 1 by way of optical fibers 15 and objective optical elements 16.

The optical system shown in FIG. 9(b) is configured to project laser beams LB to solder on the lands 4 from both sides in a direction of length or from one side in a direction of width of an electronic component 1, and applicable to the method shown in FIGS. 1 and 7. Laser beams LB emitted from a laser oscillator (not shown) are projected to reflecting mirrors 17 by way of optical fibers 15 and objective optical elements 16, and beams reflected by the reflecting mirrors 17 are projected to two lands 4 corresponding to the electronic component 1.

The optical systems shown in FIGS. 9(c) and 9(d) are fundamentally the same as that shown in FIG. 9(b), except for locations and directions of objective optical elements 16 and configuration of reflecting mirrors 17 which are different from those in the optical system shown in FIG. 9(b). In the optical systems shown in FIGS. 9(c) and 9(d), locations of laser beams LB can be adjusted by changing angles of the reflecting mirrors 17.

The optical system shown in FIG. 9(e) is configured to project a laser beam LB perpendicularly to solder on a land 4 and is applicable to the irradiation method with the laser beam shown in FIG. 8. Laser beams LB emitted from a laser oscillator (not shown) are projected simultaneously to two lands 4 corresponding to an electronic component 1 by way of optical fibers 15 and objective optical elements 16.

Figure 10:
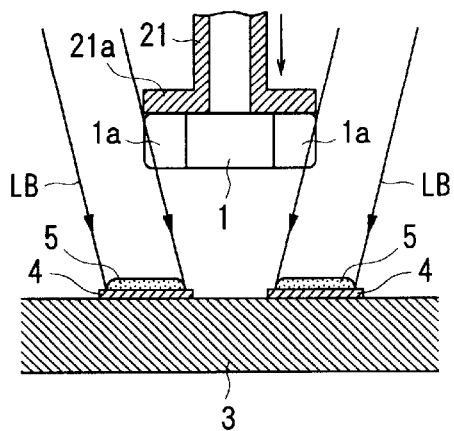
FIGS. 10(a) and 10(b) are diagrams illustrating a modified adsorbing nozzle.
Figure 10:
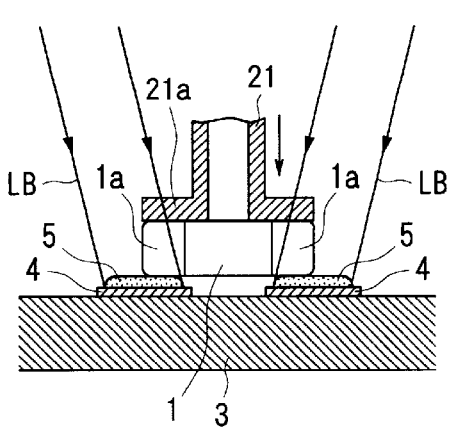

FIG. 10 show an adsorbing nozzle which has a structure different from that adopted for the first embodiment.

An adsorbing nozzle 21 shown in FIGS. 10(a) and 10(b) has a collar portion 21a at a tip thereof which covers a top surface of the electronic component 1. This adsorbing nozzle 21 is capable of suppressing thermal damage on the electronic component 1 since the collar portion 21 functions to prevent laser beams LB from irradiating external electrodes 1a of the electronic component 1, mainly a top surface thereof, which is in mid course of a lowering process.

Figure 11:
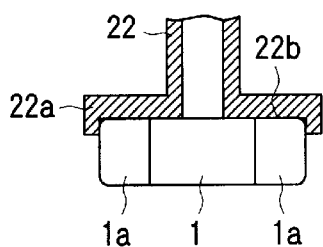
FIGS. 11(a) and 11(b) are diagrams illustrating other modified adsorbing nozzles.
Figure 11:
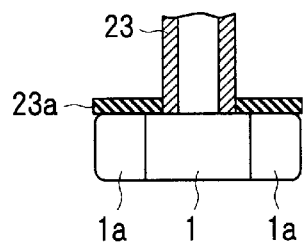

FIGS. 11(a) and 11(b) show adsorbing nozzles which have structures different from that adopted for the first embodiment.

The adsorbing nozzle 22 shown in FIG. 11(a) has not only a collar portion 22a which covers a top surface of the electronic component 1 but also a cavity 22b which is matched with a shape of the top surface of an electronic component 1 inside a collar portion 22a. This adsorbing nozzle 22 is capable of preventing the electronic component 1 from being thermally damaged by shielding mainly the top surface of external electrodes 1a of the electronic component 1 from laser beams LB in mid course of a lowering process. Further, the cavity 22b can be utilized to position the electronic component 1 relative to the adsorbing nozzle 22.

The adsorbing nozzle 23 shown in FIG. 11(b) is equipped at its tip with a filter 23a which covers a top surface of the electronic component 1. The filter 23a is composed, for example, of a reflection type ND filter which is formed by depositing chromium on a glass substrate and is capable of suppressing thermal damage of the electronic component 1 by attenuating an intensity of laser beams LB which are to fall mainly on the top surface of external electrodes 1a of the electronic component 1.

Figure 12:
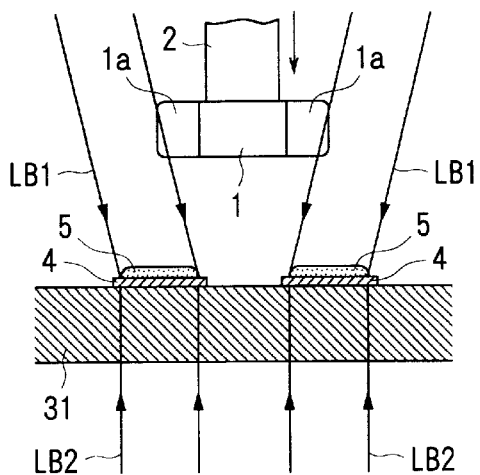
FIG. 12 is a diagram illustrating a method to heat and melt solder using second laser beams in combination.

FIG. 12 illustrates a method which heats and melts the solders 5 by using second laser beams in combination. This method is useful in a case where a substrate 31 which allows transmission of laser beams is used, and is configured to project the laser beams LB2 to the lands 4 from a bottom side (rear side) of the substrate 31 through the substrate 31 when laser beams LB1 are projected to the solders 5 on the lands 4 from a top side of the substrate 31. Since this method makes it possible to supplement heat required for heating and melting the solders 5 with the laser beams LB2 projected from the bottom side, it is capable of similarly connecting components even by using laser beams at a lower energy level as the laser beams LB1 from the top side, thereby suppressing thermal damage on the electronic component 1 due to the laser beams LB1 from the top side.

In addition, the method illustrated in FIG. 12 is useful also in a case where a substrate which does not transmit a laser beam is used since it is capable of supplementing the heat for heating and melting the solders 5 by heating portions located mainly under the lands 4 of the substrate with the laser beams LB2 which are projected to the lands 4 from the bottom side (rear side) of the substrate when the laser beams LB1 are projected to the solders 5 on the lands 4 from the top side of the substrate.

FIGS. 13(a) through 13(d) show a configuration and operations of a system which mechanically controls a timing of irradiation with laser beams. In these drawings, a reference numeral 41 represents a moving arm which supports an adsorbing nozzle 2 so as to be movable up and down under an urging force of a coil spring 42, a reference numeral 43 designates a switch which is disposed an outside surface of the moving arm 41 and used for turning on laser beams, a reference numeral 44 denotes a light shielding plate which is attached to the moving arm 41, a reference numeral 44a represents a beam passing hole formed in the light shielding plate 44, and a reference numeral 45 designates a switch which is disposed inside the moving arm 41 and used for turning off the laser beams. An optical fiber 15, an objective optical element 16 and a reflecting mirror 17 are the same as those shown in FIG. 9(d).

Figure 13:
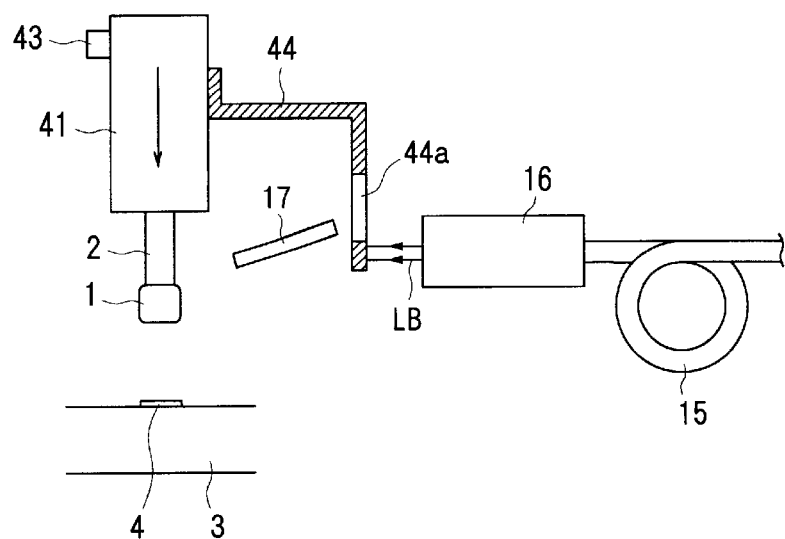
FIGS. 13(a) through 13(d) are diagrams illustrating constitutions for mechanically controlling of irradiating timing with a laser beam and operations of the constitutions.
Figure 13:
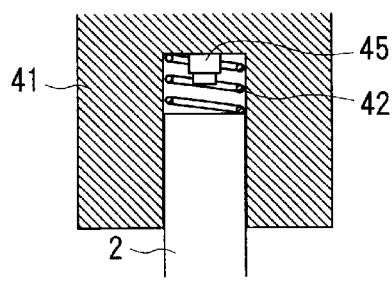
Figure 13:
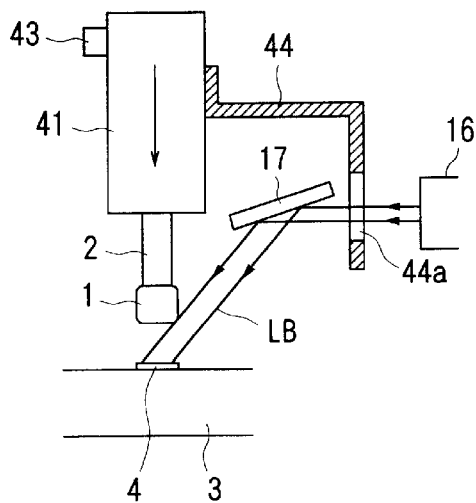
Figure 13:
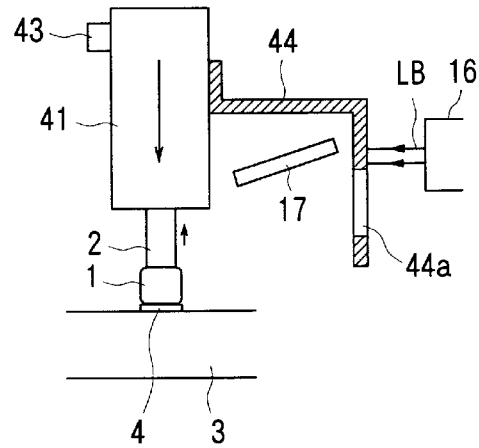

When the moving arm 41 lowers for a predetermined distance from a standby position thereof, the switch 43 turns on to allow a laser beam LB to emit through the objective optical element 16 as shown in FIG. 13(a). Since the light shielding plate 44 is interposed between the objective optical element 16 and the mirror 17 at this time, the laser beam LB emerging from the objective optical element 16 is intercepted by the light shielding plate 44.

When the moving arm 41 further lowers, the beam passing hole 44a of the light shielding plate 44 becomes coincident with an optical path of the laser beam LB as shown in FIG. 13(c), the laser beam LB emerging from the objective optical element 16 passes through the beam passing hole 44a and irradiates the reflecting mirror 17, whereby a beam reflected by the reflecting mirror 17 is projected to solder on the land 4.

The irradiation with the laser beam is carried out continuously while the electronic component 1 lowers for a distance corresponding to a vertical length of the beam passing hole 44a. After an external electrode of the lowering electronic component 1 is pressed to the solder (melted solder) on the land 4, the adsorbing nozzle 2 penetrates into the moving arm 41 against the urging force of the coil spring 42 as the moving arm 41 lowers. Upon lapse of a predetermined time after the external electrode of the electronic component 1 is pressed to the solder (melted solder) on the land 4, the light shielding plate 44 enters between the objective optical element 16 and the mirror 17 as shown in FIG. 13(d), whereby the laser beam emerging from the objective optical element 16 is intercepted by the light shielding plate 44. Simultaneously, the switch 45 which turns off the laser beam is activated by the adsorbing nozzle 2 penetrating into the moving arm 41, thereby stopping the emission of the laser beam through the objective optical element 16.

By adopting such a configuration, it is possible to mount components as in the first embodiment by mechanically controlling the timing of the irradiation with the laser beam LB without performing a sequence control such as that adopted in the first embodiment. Needless to say, the light shielding plate 44 is not always necessary when the actuating positions of the switches 43 and 45 which turn on and off the laser beam can be defined strictly.

Figure 14:
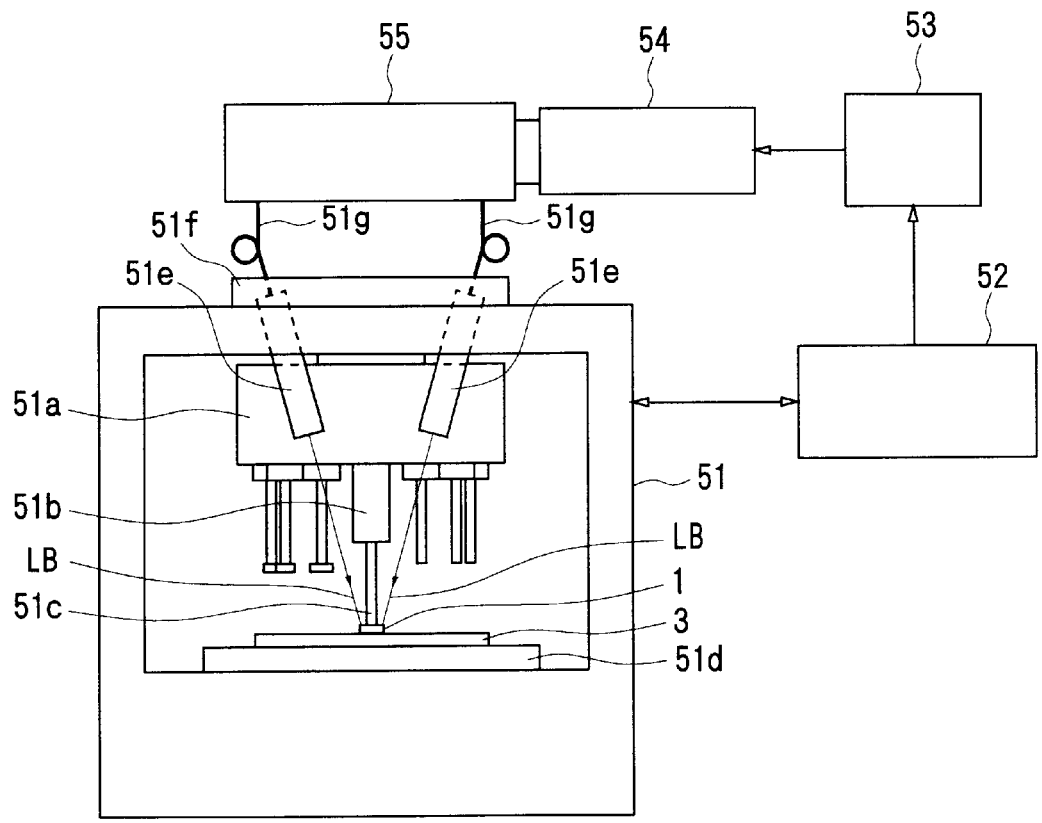
FIG. 14 is a constitutional diagram illustrating a mounting machine in a second embodiment of the present invention, and an optical system and a control system which are used in the mounting machine.
Figure 15:
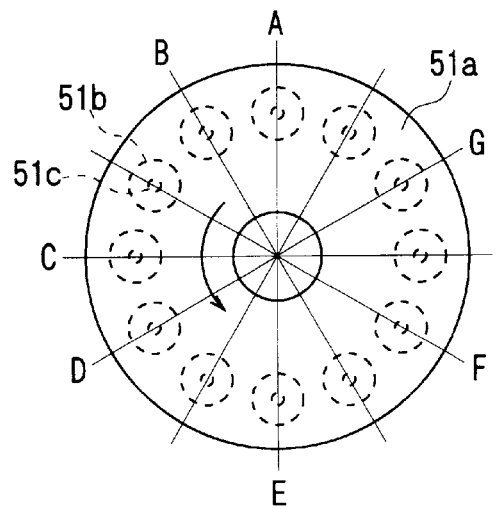
FIG. 15 is a top view of a rotating head in the second embodiment.
Figure 16:
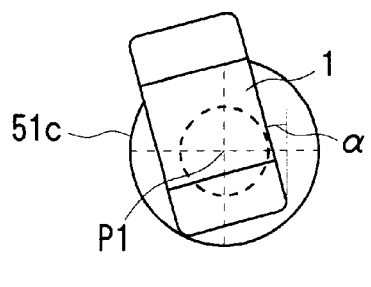
FIGS. 16(a) and 16(b) are diagrams illustrating a method to control a position of an adsorbed electronic component in the second embodiment.
Figure 16:
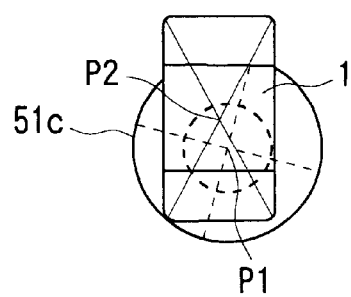

FIGS. 14 through 16 illustrate a second embodiment of the present invention. FIG. 14 being a constitutional diagram showing a mounting machine, and an optical system and a control system which are used with the mounting machine, FIG. 15 being a top view of a rotating head, and FIG. 16 being diagrams showing procedures for correcting a position of an adsorbed electronic component.

In FIG. 14, a reference numeral 51 represents a mounting machine, a reference numeral 52 designates a computer which performs a sequence control of the mounting machine and laser oscillation, a reference numeral 53 denotes a laser power source, a reference numeral 54 represents a laser oscillator and a reference numeral 55 designates a beam slitter. The laser power source 53, the laser oscillator 54 and the beam splitter 55 are the same as those used in the first embodiment and will not be described in componenticular.

The mounting machine 51 is equipped with a rotating head 51a, twelve rods 51b which are disposed on a bottom surface of the rotating head 51a at intervals of 30 degrees, adsorbing nozzles 51c disposed on bottom surfaces of the rods 51b respectively, an XYθ table 51d which supports the substrate 3, a pair of objective optical elements 51e, an XY table 51f which supports the objective optical elements 51e and optical fibers 51g which transmit laser beams LB from a beam splitter 55 to the objective optical elements 51e.

The rotating head 51a is intermittently rotated counterclockwise as seen from above at intervals of 30 degrees by a driving source (not shown). The rods 51b are rotatable around its axial center, and movable up and down, and rotatated or moved up and down by a driving source (not shown).

The mounting machine 51 adsorbs the electronic components 1 at a location A of the rotating head 51a shown in FIG. 15, inspects heights of the adsorbed components 1 at a location B, inspects and detects widths, lengths and directions of the adsorbed components 1 at a location C, and corrects angles of the adsorbed components 1 at a location D. After correcting a mounting location and a laser beams irradiating locations with at a location E, the mounting machine mounts the adsorbed components 1 on the substrate 3, discharges defective components at a location F, and cleans nozzles at a location G.

Now, description will be made of processes to mount components in the second embodiment.

When a rod 51b is stopped at the location A by the intermittent rotation of the rotating head 51a, the mounting machine 51 first lowers the rod 51b from a raised position thereof, takes out the electronic component 1 which is supplied under the location A in an attitude rotated sideways while adsorbing it in the center of the top surface with an adsorbing nozzle 51c, and resets the rod 51b from a lowered position to the raised position.

When the rod 51b adsorbing the electronic component 1 is stopped at the location B by the intermittent rotation of the rotating head 51a, the mounting machine 51 then photographs an image of a side surface of the electronic component 1 adsorbed by the adsorbing nozzle 51c with a CCD camera (not shown) and judges whether or not a height is good on the basis of image data.

When the rod 51b adsorbing the electronic component 1 is stopped at the location C by the intermittent rotation of the rotating head 51a, the mounting machine 51 photographs an image of a bottom surface of the electronic component 1 adsorbed by the adsorbing nozzle 51c with a CCD camera (not shown), judges whether or not a width, a length and a direction are good on the basis of image data, and detects deviation amounts in the XYθ directions when the direction is improper.

The deviation amounts in the XYθ directions are detected as described below. First, a deviation amount α of the electronic component 1 in the θ direction from a standard line passing through a center P1 of the adsorbing nozzle 51c is detected from the image of the bottom surface of the electronic component 1 obtained with the CCD camera as shown in FIG. 16(a). Then, locations of a center P1 of the adsorbing nozzle 51c and a center P2 of the electronic component 1 on an XY coordinates system are detected in a condition where the adsorbing nozzle 51c is rotated by the angle corresponding to the deviation amount a in the θ direction as shown in FIG. 16(b), thereby detecting deviation amounts in the X direction and the Y direction from relative locations.

When the adsorbed component 1 has an deviation amount a in the θ direction in a condition where the rod 51b adsorbing the electronic component 1 is stopped at the location D by the intermittent rotation of the rotating head 51a, the rod 51b is rotated by the angle corresponding to the deviation amount a to correct the deviation.

When the adsorbed electronic component 1 has such deviation amounts as those described above in the X direction and the Y direction in a condition where the rod 51b is stopped at the location E by the intermittent rotation of the rotating head 51a, a mounting location is corrected by displacing the table 51d in the XY directions to correct the deviation and locations to be irradiated with the laser beams are corrected by displacing the table 51f in the XY directions. Then, the mounting machine 51 lowers the rod 51b (adsorbing nozzle 51c) from the raised position and connects a component through processes which are the same as those illustrated in FIGS. 1(a) through 1(f).

When the electronic component 1 is judged as a defective component as results of the dimensional inspections at the locations B and C, component mounting is not carried out at the location E and the electronic component 1 is moved to the location F as it is kept in the adsorbed condition. When the rod 51b is stopped at the location F by the intermittent rotation of the rotating head 51a, the defective electronic component 1 is released from the adsorption by the adsorbing nozzle 51c, allowed to drop by its own weight and recovered into a container or the like.

When the rod 51b is stopped at the location G by the intermittent rotation of the rotating head 51a, air is blasted to the adsorbing nozzle 51c to carry out cleaning of a nozzle.

As apparent from the foregoing description, the second embodiment is capable of successively carrying out component mounting in the course of the intermittent rotation of the rotating head 51a with laser beams which are similar to those used in the first embodiment.

Further, the second embodiment is capable of mounting the electronic component 1 at a precise location on the substrate 3 since it is configured to detect deviation amounts in the XYθ directions of the electronic component 1 adsorbed by the adsorbing nozzle 51c, and correct the component mounting location and the locations to be irradiated with the laser beams on the basis of the deviation amounts at a stage preceding to the component mounting.

Furthermore, the second embodiment is capable of preventing the defective electronic component 1 from being mounted on the substrate 3 by accident since it is configured to detects dimensions of the electronic component 1 adsorbed by the adsorbing nozzle 51c, not to carry out the component mounting when the dimensions are judged as improper and recover the electronic component 1 when it is improper in dimensions thereof.

The second embodiment is described as an example wherein the objective optical elements 51e themselves are moved to correct the locations to be irradiated with the laser beams. When the optical system shown in FIGS. 9(b) through 9(d) which uses the mirrors is used, however, it is possible to similarly correct locations to be irradiated with laser beams by changing angles of the mirrors. Needless to say, it is possible to perform a similar correction by using other optical path changing elements such as prisms.

Figure 17:
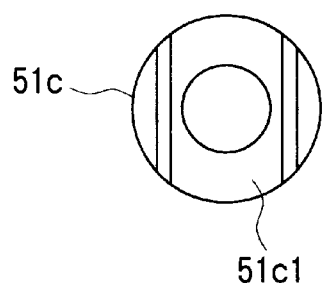
FIGS. 17(a) and 17(b) are diagrams illustrating a modified adsorbing nozzle.
Figure 17:
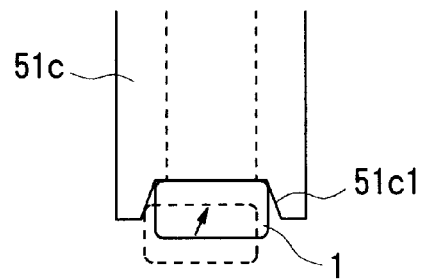

The second embodiment exemplifies adsorbing nozzles which has flat tip surfaces as the adsorbing nozzles 51c. When a guide cavity 51c1 which has a tapered surface is formed in the adsorbing nozzle 51c as shown in FIG. 17(a), however, it is possible to correct a deviation in the θ direction by correcting adsorbed position of the electronic component 1 relative to the adsorbing nozzle 51c by utilizing the guide cavity 51c1 as shown in FIG. 17(b).

In addition, though the electronic component having flat prism-shaped and a pair of the external electrodes at both the ends in the longitudinal direction is exemplified as an electronic component in the first and second embodiments described above, it is needless to say that the mounting method is applicable also to any kind of electronic component such as an electronic component which has a form other than the flat prism-shaped, an electronic component which has external electrodes at locations other than both ends in a longitudinal direction or an electronic component which has lead terminals.

Further, though the solder is used as a connecting material in the first and second embodiments described above, component mounting can be carried out using metallic materials other than the solder or electrically conductive resin materials which can be melted by laser beams.

What is claimed is:

1. A method of manufacturing a circuit module wherein an electrode of an electronic component is connected to an electrode of a substrate by way of a connecting material, comprising the steps of:

melting a mass of connecting material preliminarily disposed on the electrode of the substrate by irradiating the mass with a laser beam; and then loading the electronic component on the substrate so as to press the electrode of the electronic component to the melted mass before the melted mass hardens.

2. The method of claim 1, further including
continuing the irradiation of the mass with the laser beam while the electrode of the electronic component is pressed further against the melted mass.

3. The method of claim 1, further including irradiating the electrode of the electronic component which is being loaded on the substrate with at least a portion of the irradiating laser beam from mid course of loading.

4. The method of claim 3, wherein
at least one irradiating optical path of the laser beam and a loading path of the electronic component is inclined at an acute angle relative to a mounting surface of the substrate, whereby the electrode of the electronic component being loaded on the substrate enters the irradiating path of the laser beam from mid course of the component loading.

5. The method of claim 4, further including controlling the time interval during which the electrode of the electronic component is irradiated with the laser beam so it is a function of at least one of (a) an inclination angle of at least one (i) of the irradiating optical path of the laser beam and (ii) the loading path of the electronic component, and (b) the loading speed of the electronic component.

6. The method of claim 4, further including controlling the power of the irradiating laser beam after the electrode of the electronic component which is being loaded on the substrate enters the irradiating optical path of the laser beam so the beam power is weaker than the power of the irradiating laser beam before the electrode of the electronic component enters the irradiating optical path of the laser beam.

7. The method of claim 1, further including irradiating the electrode of the substrate with a second laser beam from a side of a surface opposite to a mounting surface of the substrate while the laser beam recited in claim 1 irradiates the connecting material on the electrode from a side of the mounting surface of the substrate.

8. The method of claim 7, wherein the substrate transmits the second laser beam to the mounting surface of the substrate.

9. The method of claim 1, further including shaping the irradiating laser beam that irradiates the connecting material so it has a shape which is matched with a planar shape of the connecting material.

10. The method of claim 1, wherein the connecting material is solder.

11. A method of bonding an electrode of an electronic component to an electrode on a substrate with a mass of meltable material preliminarily disposed on the substrate electrode comprising the steps of melting the mass and then pressing the electrode of the component against the mass before the mass hardens.

12. The method of claim 11 wherein the mass is melted by heating in response to irradiation of the mass by an energy beam.

13. The method of claim 12 wherein at least a portion of the beam irradiates at least a portion of the component electrode prior to the component electrode being pressed against the melted mass.

14. The method of claim 13 further including irradiating the mass with the energy beam to prevent the mass from hardening while the component electrode is pressed against the melted mass so that the melted mass forms a meniscus against a wall arrangement of the component electrode.

15. The method of claim 14 further including the step of terminating irradiation of the melted mass by the energy beam while continuing to press the component electrode against the mass before the mass hardens.

16. The method of claim 15 further including gradually increasing the power of the irradiating beam as it is incident on the mass so that initially the power of the irradiating beam as it is incident is low and gradually increases, then reducing the power of the irradiating beam as it is incident on the mass as the electrodes of the component are exposed to the irradiating beam, and then further reducing the power of the irradiating beam incident on the mass while the component electrode is pressed against the mass before the mass hardens.

17. The method of claim 16 wherein the further reduction is gradual.

18. The method of claim 12 further including irradiating the mass with the energy beam to prevent the mass from hardening while the component electrode is pressed against the melted mass so that the melted mass from a meniscus against a wall arrangement of the component electrode.

19. The method of claim 12 further including the step of terminating irradiation of the melted mass by the energy beam while continuing to press the component electrode against the mass before the mass hardens.

20. The method of claim 18 further including gradually increasing the power of the irradiating beam as it is incident on the mass so that initially the power of the irradiating beam incident on the mass is low and gradually increases.

21. The method of claim 20 further including reducing the power of the irradiating beam as it is incident on the mass while the component electrode is pressed against the mass before the mass hardens.

22. The method of claim 12 further including reducing the power of the irradiating beam as it is incident on the mass while the component electrode is pressed against the mass before the mass hardens.

23. The method of claim 22 wherein the further reduction is gradual.

* * * * *